United States Patent [19]

Ninh et al.

[11] Patent Number: 5,801,749
[45] Date of Patent: Sep. 1, 1998

[54] UNIVERSAL AUDIO/VIDEO SIGNAL CONVERTER

[75] Inventors: Loi Ninh, Foothill Ranch; Barry D. Hackworth, Cerritos, both of Calif.

[73] Assignees: Sony Corporation, Tokyo, Japan; Sony Electronics Inc., Park Ridge, N.J.

[21] Appl. No.: 572,283

[22] Filed: Dec. 13, 1995

[51] Int. Cl.$^6$ ...................................................... H04N 7/10
[52] U.S. Cl. ............................ 348/6; 455/3.1; 348/8; 333/25
[58] Field of Search ............................ 348/6, 7, 8, 13; 455/3.1, 6.1, 6.2, 4.2, 5.1, 6.3; 370/90.01, 93.05, 93.06, 93.07; 333/25, 26, 32

[56] References Cited

U.S. PATENT DOCUMENTS

| 552,160 | 5/1895 | Ku | 348/731 |
|---|---|---|---|
| 4,054,910 | 10/1977 | Chou et al. | 455/3.1 |
| 4,203,009 | 5/1980 | Tattersall | 379/399 |
| 4,615,044 | 9/1986 | Killion | 333/25 |
| 4,717,896 | 1/1988 | Graham | 333/25 |
| 4,766,402 | 8/1988 | Crane | 333/25 |
| 4,800,344 | 1/1989 | Graham | 333/25 |
| 4,885,747 | 12/1989 | Foglia | 348/8 |
| 5,084,864 | 1/1992 | Turnbull et al. | 455/6.3 |
| 5,283,789 | 2/1994 | Gunnarsson et al. | 348/6 |
| 5,495,212 | 2/1996 | DeCramer | 333/25 |
| 5,633,614 | 5/1997 | DeCramer | 333/25 |
| 5,779,058 | 10/1988 | Meyer | 330/188 |

*Primary Examiner*—John K. Peng
*Assistant Examiner*—Linus H. Lo

[57] ABSTRACT

In low power audio and video applications, an audio/video signal converter converts balanced and unbalanced signals using a first converter which converts a balanced signal to an unbalanced signal and a second converter which converts an unbalanced signal to a balanced signal. The first and second converters may be selected (either separately or in any combination) based on any desired signal conversion. The input impedances, output impedances, and the gains, of each of the first and second converters, may be adjusted either manually or automatically, and either independently or jointly, for proper loading and termination of signals.

28 Claims, 6 Drawing Sheets

UNIVERSAL AUDIO/VIDEO SIGNAL CONVERTER

BACKGROUND OF THE INVENTION

1. Field of the Invention

This invention relates generally to the field of audio and video signal conversion for low power applications. More particularly, this invention relates to converting signals efficiently and accurately, without adding distortion, by using matched or mismatched input/output impedances for proper loading and termination of signals and by controlling the gain.

2. General Background

A universal audio/video signal converter according to the present invention may be used in low power audio and video applications, where balanced-to-unbalanced, and unbalanced-to-balanced, signal conversion is desirable. In addition, a converter according to the present invention could be used in signal distribution requirements where multiple taps from one signal source is desired, whether the transmission line is long or short, with minimal loading effects to the source transmission line (for example, in cable television distribution for apartments, hospitals, trains, cruise lines, airplanes, studio recording/playing etc).

In various products using conventional signal conversion applications, video isolation transformers have been used to convert signals—for example, to convert a balanced input signal (i.e. a differential signal) to an unbalanced output signal (i.e. a single-ended output). Although a video isolation transformer may generally achieve the purposes described above, i.e. converting one type of signal to another, many problems are introduced and must be dealt with in the implementation of a video isolation transformer.

First, video isolation transformers generally offer poor impedance matching leading to the attenuation of the video signal (by "matching" the impedance, maximum power transfer and an accurately reproduced signal may be achieved) and bandwidth characteristics that make measurements unreliable, leading to inaccurate results and data (the harmonic distortion generated by the transformer may also cause a lower quality reproduced signal).

Second, the magnetic field generated by a video isolation transformer requires shielding and additionally restricts various electronic elements from being placed in close proximity to the transformer.

Finally, video isolation transformers tend to be bulky, which leads to some signal degradation, and costly.

In view of the problems associated with the conventional "video isolation transformer" signal conversion means described above, it is desirable to provide a signal conversion device which can accurately convert both a balanced signal to an unbalanced signal, and, an unbalanced signal to a balanced signal, wherein the type of conversion may be easily selected.

SUMMARY OF THE INVENTION

Therefore, and in accordance with the objects of the invention, there is provided a signal conversion device which can accurately convert both a balanced signal to an unbalanced signal, and, an unbalanced signal to a balanced signal, wherein the type of conversion may be easily selected.

It is a further object of the present invention to provide a signal conversion device in which an input signal could be converted by two circuits, connected in a back-to-back configuration or a loop configuration, from a balanced signal to an unbalanced signal to an unbalanced signal to a balanced signal, or, from an unbalanced signal to a balanced signal to a balanced signal to an unbalanced signal.

It is a feature that the present invention provides the ability to select, in addition to the signal conversion type, the input and output impedances and the circuit gain.

It is an advantage that the present invention provides a single device in which multiple conversions, variable input and output impedances, and variable gains, can be controlled, either manually or automatically (by software, for example) to obtain a desired audio/video signal conversion.

It is a further advantage of the present invention to minimize signal distortion and to maximize power transfer by selecting desirable input and output impedances, gain and signal conversion type.

These and other objects and advantages are achieved in accordance with one aspect of the invention with an audio/video signal converter having balanced input ports for receiving a balanced input signal, an unbalanced input port for receiving an unbalanced input signal, a first converter which converts a balanced signal to an unbalanced signal and a second converter which converts an unbalanced signal to a balanced signal. The input and output impedances, and the gains, of the first converter and the second converter, may all be adjusted either manually or automatically. In addition, the first converter and the second converter may be selected based on a desired conversion. A balanced output port and an unbalanced output port are provided for outputting a balanced output signal and an unbalanced output port, respectively.

These and other objects, advantages and features of the invention will become apparent to those skilled in the art upon consideration of the following description of the invention.

The features of the invention believed to be novel are set forth with particularity in the appended claims. The invention itself however, both as to organization and method of operation, together with further objects and advantages thereof, may be best understood by reference to the following description taken in conjunction with the accompanying drawings.

DETAILED DESCRIPTION OF THE INVENTION

Figure 1A:
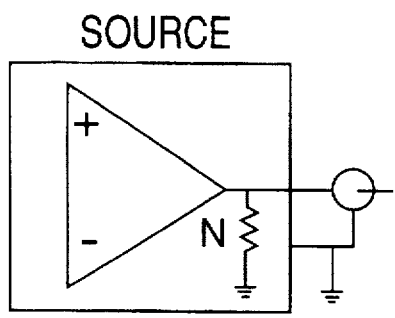
FIG. 1, consisting of 1(a)–1(d), illustrates the various conversion possibilities from source output to receiving circuit.
Figure 1A:
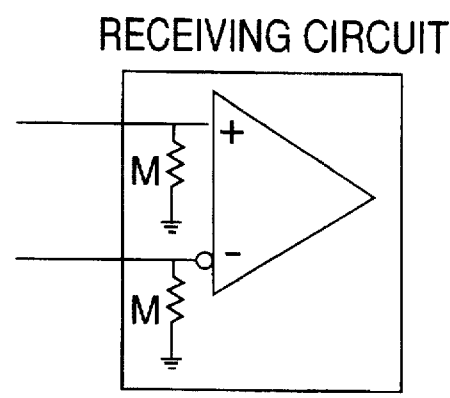

An embodiment of an audio/video signal converter for converting a balanced signal to an unbalanced signal, an unbalanced signal to a balanced signal, for adjusting an input impedance of the converters, for adjusting an output impedance of the converters, for adjusting a gain of the converters, and for selecting the type of conversions, all according to a desired transformation, will now be described in detail with reference to the accompanying drawings. It should be understood that the present disclosure is to be considered as an example of the principles of the invention and not intended to limit the invention to the specific embodiments shown and described. In the description below, like reference numerals are used to describe the same, similar or corresponding parts in the several views of the drawing.

As stated above, the invention relates generally to the field of audio and video signal conversion for low power applications, and more particularly, to converting balanced and unbalanced signals efficiently and accurately, without adding distortion, by using matched or mismatched input/output impedances for proper loading and termination of signals, and by adjusting the gain accordingly.

Turning now to FIG. 1, each of FIGS. 1(a) through 1(d) provides an illustration of various possible conversions and illustrates why the conventional use of each of these respective "source" output circuits and "receiving" circuits would have impedance and circuit "mismatching" and would therefore add distortion to any signal.

Specifically, in FIG. 1(a) an illustration is provided showing a condition wherein a source output (i.e., a point to be measured or a circuit output), shown on the left, having an impedance "N", is unbalanced, and a receiving circuit, shown on the right, having an input impedance "M", is balanced, or differential.

Figure 1B:
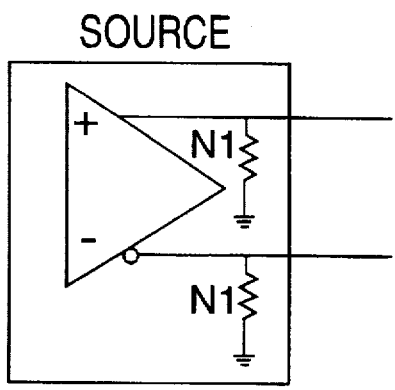
Figure 1B:
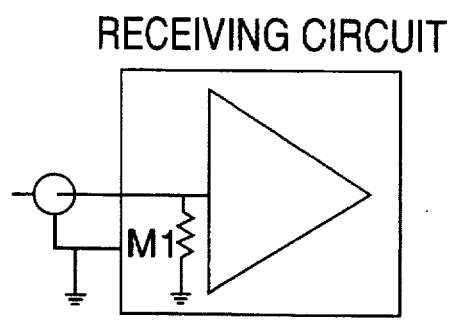
Figure 1C:
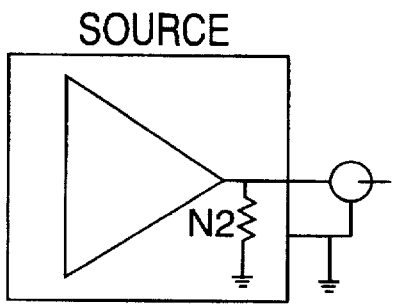
Figure 1C:
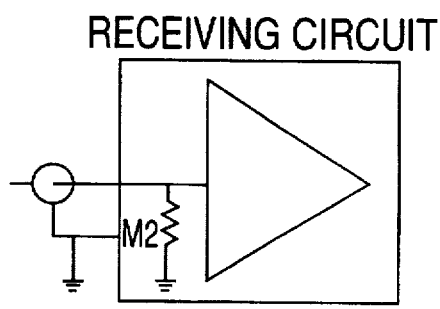

In FIG. 1(b) an illustration is provided showing a condition wherein a source having an impedance "N1", is balanced, and a receiving circuit having an input impedance "M1", is unbalanced.

FIG. 1 (c) illustrates a condition wherein a source having an impedance "N2", is unbalanced, and a receiving circuit having an input impedance "M2", is unbalanced.

Figure 1D:
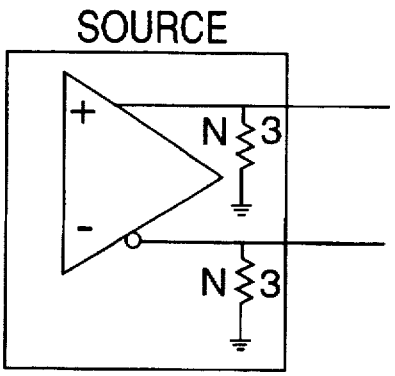
Figure 1D:
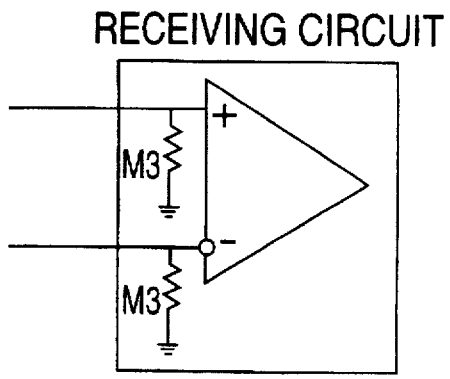

And finally, FIG. 1(d) illustrates a condition wherein a source having an impedance "N3", is balanced, and a receiving circuit having an input impedance "M3", is balanced.

In each of the circuit possibilities illustrated in FIGS. 1(a) through 1(d), "circuit mismatch", together with differing output impedances of each of the "source" outputs from the input impedances of each of the corresponding "receiving circuits", leads to the distortion of the signals.

Figure 2A:
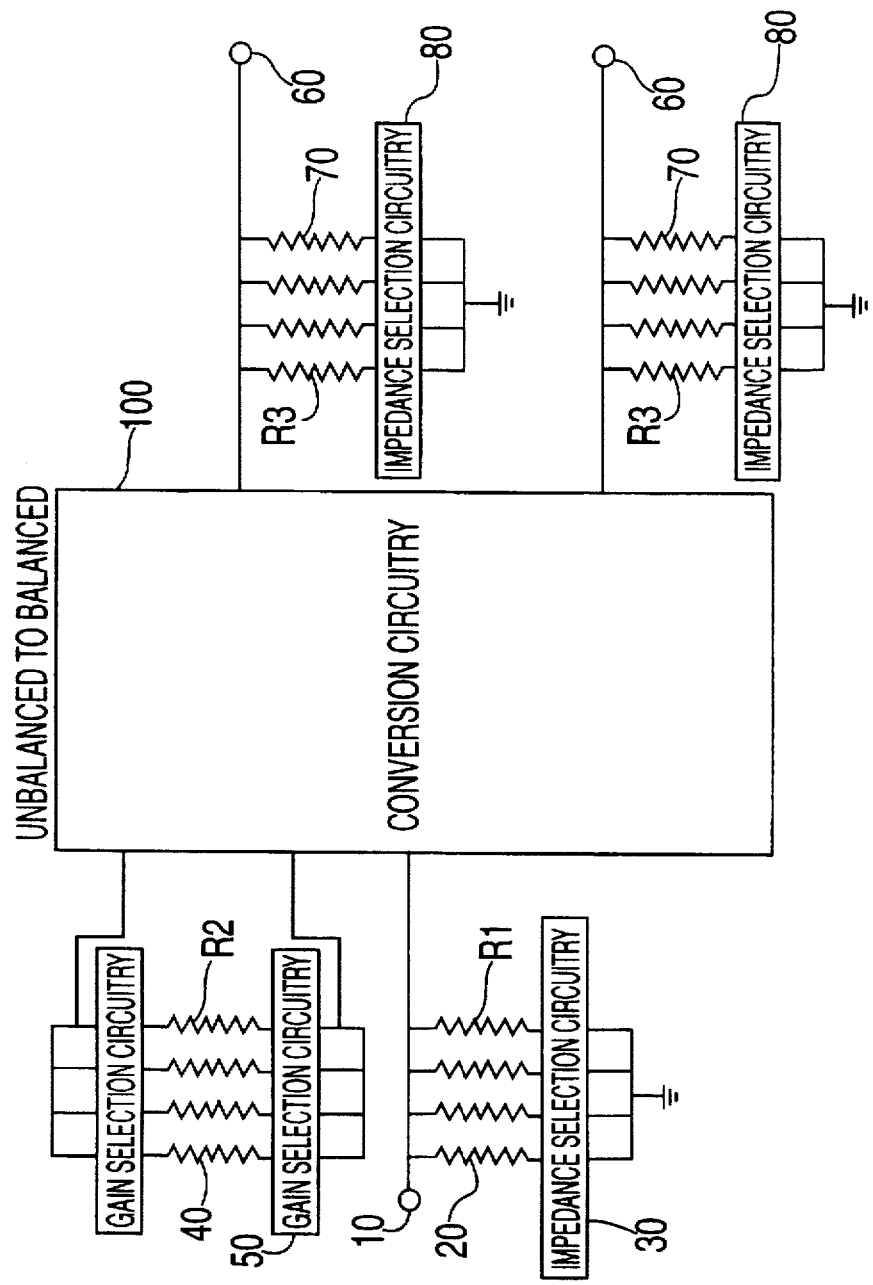
FIG. 2, consisting of 2(a) and 2(b), shows a schematic diagram of a preferred embodiment of an audio/video signal converter of the present invention, showing specifically a conversion from an unbalanced signal to a balanced signal (FIG. 2(a)) and a conversion from a balanced signal to an unbalanced signal (FIG. 2(b)).
Figure 2B:
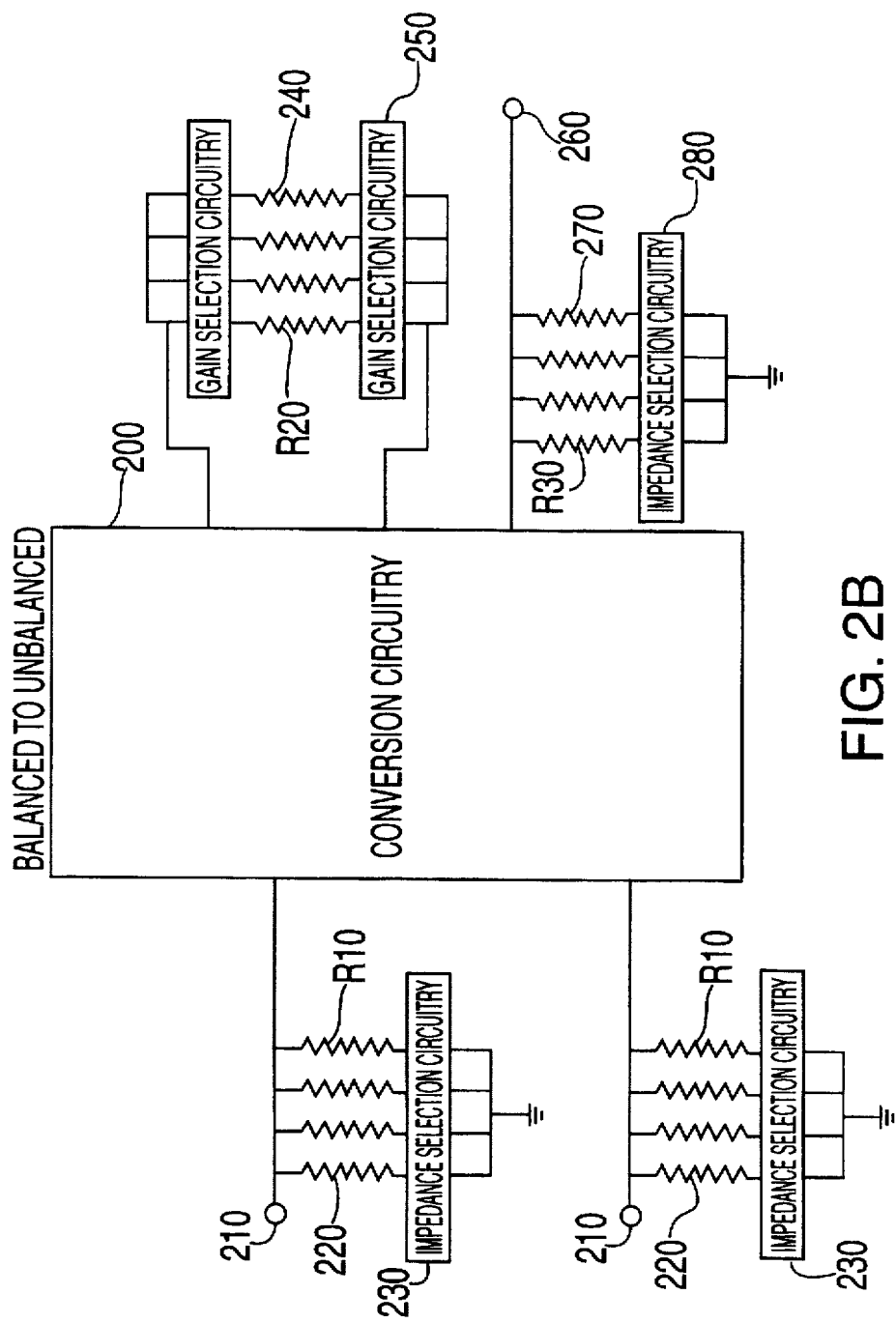

A schematic diagram of an audio/video signal converter of the present invention is shown in FIG. 2 (consisting of FIGS. 2(a) and 2(b)). Specifically, FIG. 2(a) shows a circuit including a block representation of conversion circuitry 100 for converting an unbalanced signal to a balanced signal (either by a single conversion device, for example, an integrated circuit, by discrete design, or, by a combination of both). An example of conversion circuitry capable of performing such conversions is the MAX 435 and MAX 436 (manufactured by MAXIM) wideband transconductance amplifiers, which convert unbalanced signals to balanced signals and balanced signals to unbalanced signals, respectively.

In FIG. 2(a), a signal is input to the conversion circuitry 100 through input 10 and meets a transmission line (load) terminator (i.e. input impedance 20), from line to circuit return, to minimize distortion and maximize power transfer to the input. The input impedance 20, which is labeled R1 (each of the "variable impedances" in this figure are shown, only to indicate that the value is variable, as four resistors) may be controlled manually or automatically (by input impedance selection circuitry 30), depending on the application (i.e. the desired conversion).

The gain of the conversion circuitry 100, determined by impedance 40, which is labeled R2, may also be controlled manually or automatically (by gain selection circuitry 50), depending on the application. The impedance 40 (which controls the gain selection circuitry 50), is connected to the conversion circuitry 100 at the gain control pins. The signal potential, combined with the circuit's gain, is transferred to the differential outputs 60, and transmission line terminations (i.e. output impedance 70) on each line to circuit return at both ends of the transmission line, again, to minimize distortion and maximize power transfer. The output impedance 70, which is labeled R3, may also be controlled manually, or, automatically (by output impedance selection circuitry 80), depending on the application.

FIG. 2(b) shows a circuit 200 for converting a balanced signal (input to differential inputs 210) to an unbalanced signal (output at single-ended output 260), wherein an input signal meets the transmission line terminators (i.e. input impedances 220), for each line to circuit return, to minimize distortion and maximize power transfer to the input. This potential, combined with the circuit's gain (again, determined by impedance R20, labeled 240, based on gain selection circuitry 250), is transferred to the non-differential (i.e., unbalanced) output and transmission line terminations on both ends of the transmission line, again, to minimize distortion and maximize power transfer. As described in detail above with respect to the unbalanced to balanced signal conversion shown in FIG. 2(a), the balanced to unbalanced signal conversion shown in FIG. 2(b) also controls the input impedance R10, the gain selection impedance R20, and the output impedance R30, by each of the corresponding selection circuitry (230, 250 and 280, respectively), again, depending on the application.

Figure 3:
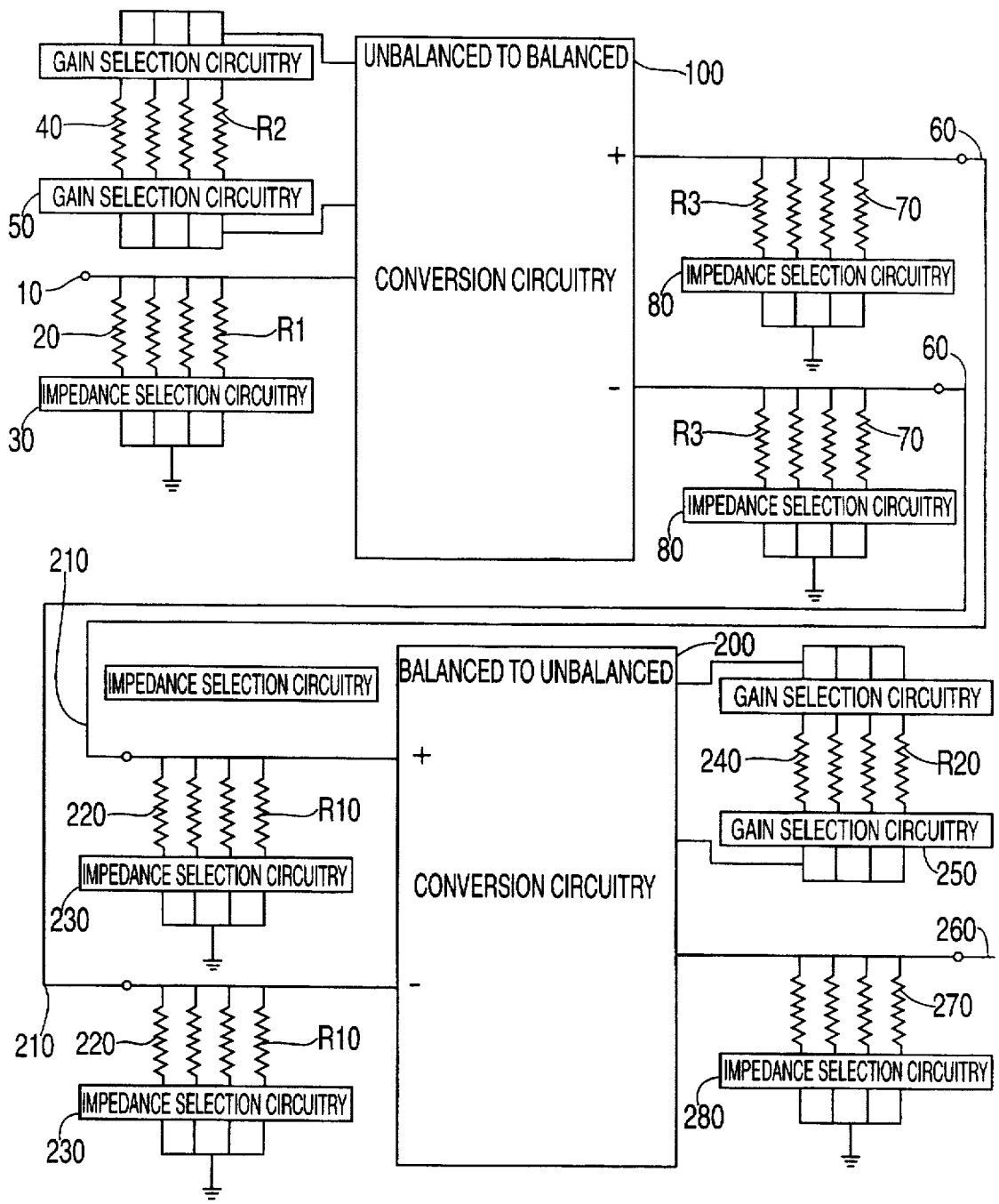
FIG. 3 shows a schematic diagram combining the conversions shown in FIGS. 2(a) and 2(b), and shows specifically a conversion from an unbalanced signal to a balanced signal to a balanced signal to an unbalanced signal.
Figure 4:
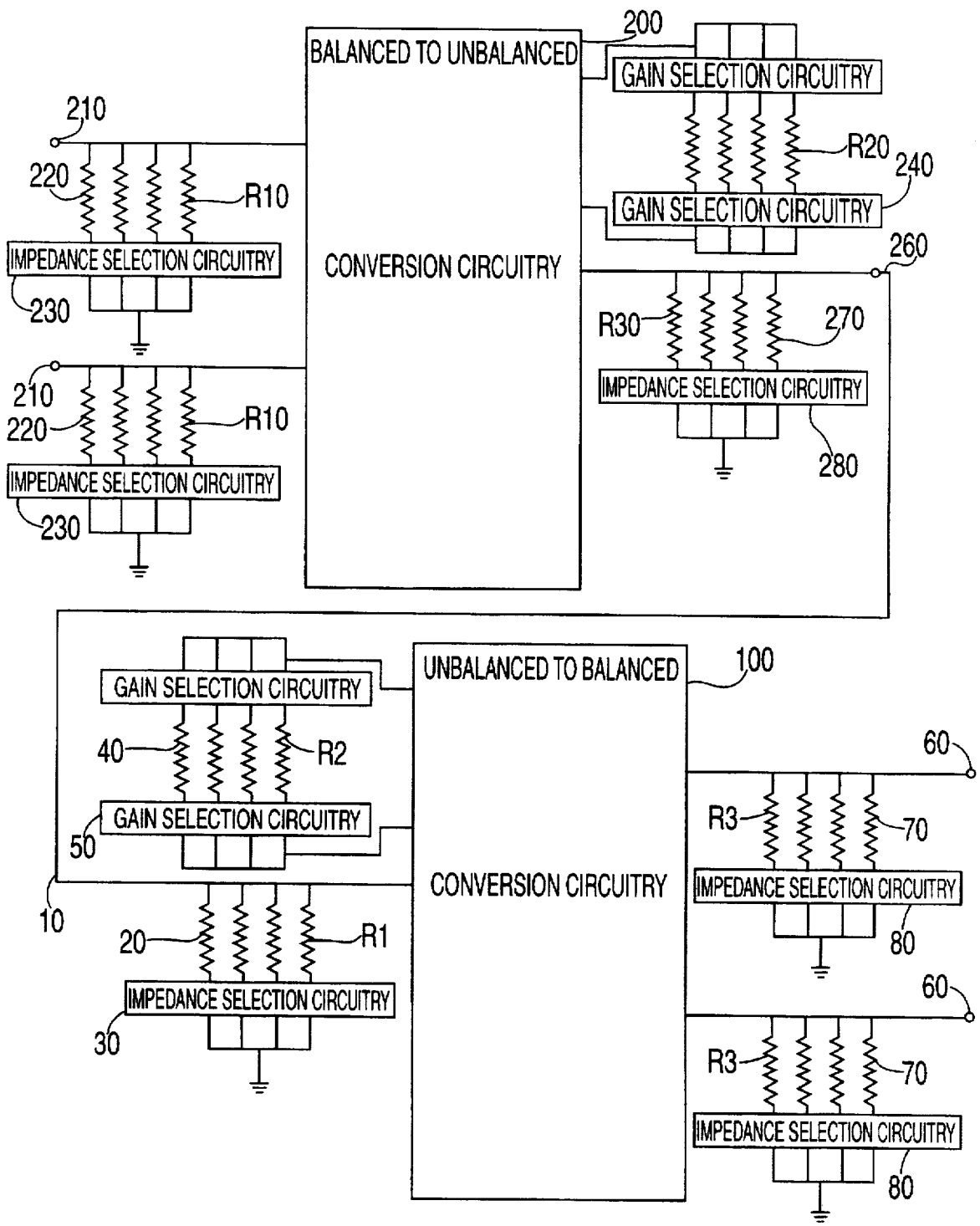
FIG. 4 shows a schematic diagram combining the conversions shown in FIGS. 2(b) and 2(a), and shows specifically a conversion from a balanced signal to an unbalanced signal to an unbalanced signal to a balanced signal FIG. 5, consisting of FIGS. 5(a) and 5(b), illustrates two equivalent circuits for a balanced output circuit and a balanced input circuit, respectively.

FIG. 3 illustrates how the two single conversion circuits shown in FIGS. 2(a) and 2(b), respectively, may be combined to form a circuit which can convert an unbalanced signal to a balanced signal to a balanced signal to an unbalanced signal, while FIG. 4 illustrates how the two individual circuits shown in FIGS. 2(b) and 2(a), respectively, may be combined to form a circuit which can convert a balanced signal to an unbalanced signal to an unbalanced signal to a balanced signal. Specifically, in FIG. 3, the balanced output of conversion circuitry 100 is connected as an input to the balanced input of conversion circuitry 200. In FIG. 4, the single-ended (or unbalanced) output of conversion circuitry 200 is input to the single-ended input of conversion circuitry 100.

In each of FIGS. 3 and 4, the conversion circuits of FIGS. 2(a) and 2(b) are connected in a back-to-back or a loop configuration as a means of impedance matching two dissimilar impedances. For example, a 75 unbalanced input signal may be converted, by the circuit shown in FIG. 3, to a 300 ohm unbalanced output signal, by adjusting the input impedance, the output impedance and the gain of the conversion circuitry, as necessary to achieve that conversion.

Figure 5A:
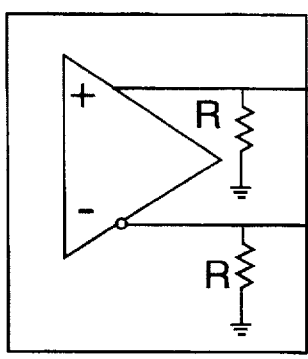
Figure 5A:
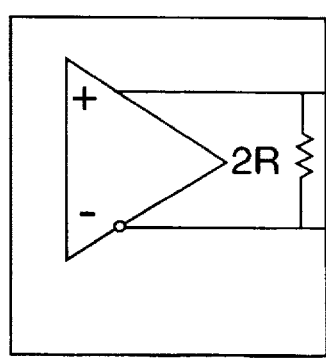
Figure 5B:
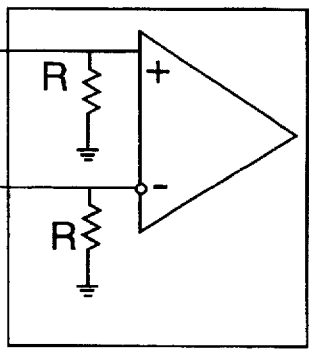
Figure 5B:
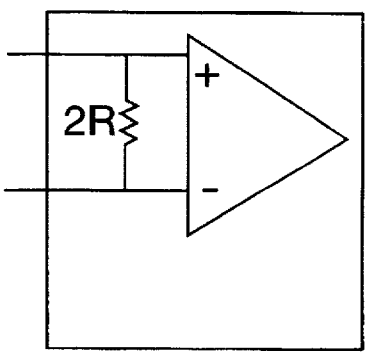

Finally, turning to FIG. 5, FIG. 5(a) shows two equivalent circuits of a receiving circuit balanced output. FIG. 5(a) further illustrates that the circuit on the left is a preferable configuration, for purposes of the audio/video signal converter described herein, in that any noise will be canceled out in that configuration (the noise will not be canceled out in the right-hand circuit). FIG. 5(b) shows two equivalent circuits of a balanced (or differential) input. However, like FIG. 5(a), FIG. 5(b) illustrates that the circuit on the left is a preferable configuration for purposes of the audio/video signal converter described herein in that, again, any noise will be canceled out in the left hand configuration.

Accordingly, it should be noted that while each of the preferred left-hand circuit configurations (of FIG. 5) is shown in FIGS. 2 through 4, the right-hand equivalent circuits could also be implemented in an audio/video signal converter according to the present invention.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. An audio/video signal converter for converting balanced and unbalanced signals based on a desired signal conversion, comprising:

first conversion means for converting a balanced signal to an unbalanced signal;
second conversion means for converting an unbalanced signal to a balanced signal;
first adjustment means for adjusting an input impedance of said first conversion means;
second adjustment means for adjusting an input impedance of said second conversion means;
third adjustment means for adjusting an output impedance of said first conversion means;
fourth adjustment means for adjusting an output impedance of said second conversion means;
first gain adjustment means for adjusting a gain of said first conversion means;
second gain adjustment means for adjusting a gain of said second conversion means; and
selection means for selecting said first conversion means and said second conversion means,
wherein said first adjustment means, said second adjustment means, said third adjustment means, said fourth adjustment means, said first gain adjustment means, said second gain adjustment means and said selection means may be independently adjusted as required to achieve any desired signal conversion.

2. An audio/video signal converter according to claim 1, wherein said selection means requires manual activation to select said first conversion means and said second conversion means.

3. An audio/video signal converter according to claim 1, wherein said first adjustment means, said second adjustment means, said third adjustment means, said fourth adjustment means, said first gain adjustment means and said second gain adjustment means require manual adjustment.

4. An audio/video signal converter according to claim 1, wherein said first conversion means and said second conversion means are connected such that an input signal may be applied to either said first conversion means or said second conversion means.

5. An audio/video signal converter according to claim 4, wherein a balanced signal is applied to said first conversion means.

6. An audio/video signal converter according to claim 5, wherein an unbalanced output signal of said first conversion means is supplied as an input to said second conversion means.

7. An audio/video signal converter according to claim 4, wherein an unbalanced signal is applied to said second conversion means.

8. An audio/video signal converter according to claim 7, wherein a balanced output of said second conversion means is supplied as a balanced input to said first conversion means.

9. An audio/video signal converter according to claim 1, wherein said selection means is automatically controlled by an external signal to select said first conversion means and said second conversion means.

10. An audio/video signal converter according to claim 1, wherein said first adjustment means, said second adjustment means, said third adjustment means, said fourth adjustment means and said gain adjustment means are automatically adjusted by external signals.

11. An audio/video signal converter for converting balanced and unbalanced signals, comprising:

balanced input ports for receiving a balanced input signal;
an unbalanced input port for receiving an unbalanced input signal;
first conversion means for converting a balanced signal to an unbalanced signal;
second conversion means for converting an unbalanced signal to a balanced signal;
first adjustment means for adjusting an input impedance of said first conversion means;
second adjustment means for adjusting an input impedance of said second conversion means;
third adjustment means for adjusting an output impedance of said first conversion means;
fourth adjustment means for adjusting an output impedance of said second conversion means; and
first gain adjustment means for adjusting a gain of said first conversion means;
second gain adjustment means for adjusting a gain of said second conversion means;
selection means for selecting said first conversion means and said second conversion means according to any desired conversion;
a balanced output port for outputting a balanced output signal; and
an unbalanced output port for outputting an unbalanced output signal.

12. An audio/video signal converter according to claim 11, wherein said selection means requires manual activation to select said first conversion means and said second conversion means.

13. An audio/video signal converter according to claim 11, wherein said first adjustment means, said second adjustment means, said third adjustment means, said fourth adjustment means, said first gain adjustment means and said second gain adjustment means require manual adjustment.

14. An audio/video signal converter according to claim 11, wherein said first conversion means and said second conversion means are connected such that an input signal may be applied to either said first conversion means or said second conversion means.

15. An audio/video signal converter according to claim 14, wherein a balanced signal is input to said first input means and is applied to said first conversion means.

16. An audio/video signal converter according to claim 15, wherein an unbalanced output signal of said first conversion means is supplied as an input to said second conversion means.

17. An audio/video signal converter according to claim 14, wherein an unbalanced signal is input to said second input means and is applied to said second conversion means.

18. An audio/video signal converter according to claim 17, wherein a balanced output of said second conversion means is supplied as a balanced input to said first conversion means.

19. An audio/video signal converter according to claim 11, wherein said selection means is automatically controlled by an external signal to select said first conversion means and said second conversion means.

20. An audio/video signal converter according to claim 11, wherein said first adjustment means, said second adjustment means, said third adjustment means, said fourth adjustment means and said gain adjustment means are automatically adjusted by external signals.

21. An audio/video signal converter according to claim 15, wherein an unbalanced signal is output from said unbalanced output port.

22. An audio/video signal converter according to claim 18 wherein an unbalanced signal is output from said unbalanced output port.

23. An audio/video signal converter according to claim 16, wherein a balanced signal is output from said balanced output port.

24. An audio/video signal converter according to claim 17, wherein a balanced signal is output from said balanced output port.

25. An audio/video signal converter according to claim 1, wherein a supply voltage source is connected to said signal converter.

26. An audio/video signal converter according to claim 11, wherein a supply voltage source is connected to said signal converter.

27. An audio/video signal converter according to claim 1, further comprising a portable rechargeable power supply.

28. An audio/video signal converter according to claim 11, further comprising a portable rechargable power supply.

* * * * *